United States Patent
Noguchi

(10) Patent No.: US 6,780,671 B2
(45) Date of Patent: Aug. 24, 2004

(54) METHOD OF ENCAPSULATING CONDUCTIVE LINES OF SEMICONDUCTOR DEVICES

(75) Inventor: Takashi Noguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/659,470

(22) Filed: Sep. 11, 2003

(65) Prior Publication Data

US 2004/0048421 A1 Mar. 11, 2004

Related U.S. Application Data

(62) Division of application No. 09/616,378, filed on Jul. 13, 2000.

(30) Foreign Application Priority Data

Feb. 17, 2000 (JP) .......................................... 2000-039302

(51) Int. Cl.[7] .......................... H01L 21/44; H01L 21/48; H01L 21/50
(52) U.S. Cl. ........................ 438/106; 438/112; 438/127
(58) Field of Search ............................ 438/106, 51, 55, 438/64, 107, 108, 112, 124, 126, 127

(56) References Cited

U.S. PATENT DOCUMENTS

| | | | | |
|---|---|---|---|---|
| 4,961,105 A | * | 10/1990 | Yamamoto | 257/679 |
| 5,036,024 A | | 7/1991 | Mine et al. | |
| 5,311,060 A | | 5/1994 | Rostoker et al. | |
| 5,539,250 A | * | 7/1996 | Kitano et al. | 257/666 |
| 5,847,430 A | * | 12/1998 | Hidaka | 257/355 |
| 5,962,917 A | | 10/1999 | Moriyama | |
| 6,048,754 A | * | 4/2000 | Katayama et al. | 438/115 |
| 6,121,645 A | * | 9/2000 | Masuda et al. | 257/207 |
| 6,707,166 B1 | * | 3/2004 | Noguchi | 257/790 |

FOREIGN PATENT DOCUMENTS

| | | |
|---|---|---|
| JP | 19-122974 | 11/1974 |
| JP | 5-218116 | 8/1993 |

* cited by examiner

Primary Examiner—David Nhu
(74) Attorney, Agent, or Firm—Volentine Francos, PLLC

(57) ABSTRACT

A semiconductor device includes a first wall and a second wall. The first wall is arranged in a pad region which surrounds a chip region, and the second wall is arranged on a semiconductor chip mounted in the chip region. Conductive lines are arranged between the first wall and the second wall and are encapsulated by an encapsulating material formed between the first and second walls.

15 Claims, 7 Drawing Sheets

METHOD OF ENCAPSULATING CONDUCTIVE LINES OF SEMICONDUCTOR DEVICES

CROSS REFERENCE TO RELATED APPLICATIONS

This is a divisional application of application Serial No. 09/616,378, filed Jul. 13, 2000, which is hereby incorporated by reference in its entirety for all purposes.

FIELD OF THE INVENTION

The present invention relates to a semiconductor device, and more particularly, the present invention relates to a semiconductor device which has a chip on board (COB) structure and to a method for manufacturing such a device.

BACKGROUND OF THE INVENTION

A chip on board (COB) is well known as a mounting structure which is fabricated without a molding to reduce costs.

A conventional COB structure is shown in FIG. 7(A) and FIG. 7(B). FIG. 7(A) is a plane view of the COB structure and FIG. 7(B) is a cross section view along the line 7B—7B shown in FIG. 7(A). In FIG. 7(A), an encapsulating material is not shown to facilitate understanding.

In the conventional structure, a semiconductor chip 1 is mounted on a substrate 2 by an adhesive 3. The semiconductor chip 1 includes plural electrode pads 4 which are formed thereon and the substrate 2 has plural conductive pads 5 which are formed thereon. Conductive lines 6, such as gold lines formed by a wire bonding apparatus, connect the electrode pads 4 with the conductive pads 5.

The semiconductor chip 1, the electrode pads 4, the conductive lines 6 and connecting points between the conductive pads 5 and the conductive lines 6 are covered by an encapsulating material 7, such as a resin. A wall 8 which surrounds the semiconductor chip 1 is used to contain the encapsulating material 7.

For efficiency, a liquid type resin which has a low coefficient of viscosity is usually used as the encapsulating material 7. That is, since the liquid type resin is fluid, an operation period is short, as compared with a resin having a high coefficient of viscosity. Further, a liquid type resin prevents air from being trapped therein in the encapsulating material. The wall 8 which prevents an outflow of the liquid type resin on the substrate is arranged in the periphery of the semiconductor chip. In this conventional example, the wall 8 is a frame which completely surrounds the semiconductor chip 1.

In such a structure, since the liquid type resin has the low coefficient of viscosity, a surface of the resin is pulled toward the wall 8 as a result of a surface tension of the wall 8. Thereby, a thickness of-the resin inside of the wall 8 is thinner than that of the vicinity of the wall 8.

When the conductive lines 6 are formed by the wire bonding apparatus, top portions 6a are formed in a part of the conductive lines 6. As a result, the top portions 6a may be exposed in places where the thickness of the resin is small. Such exposure may result in corrosion of the conductive lines, thus reducing the quality of the semiconductor device.

SUMMARY OF THE INVENTION

A first object of this invention is to provide a semiconductor device which prevents conductive lines from being exposed while maintaining a thin structure.

A second object of this invention is to provide a method for manufacturing such a device.

To achieve the object, one aspect of the invention includes a first wall and a second wall, wherein the first wall is arranged in a pad region which surrounds a chip region, the second wall is arranged on a semiconductor chip mounted in the chip region, and conductive lines are arranged between the first wall and the second wall and are encapsulated by a encapsulating material formed between the first and second walls.

According to another aspect of the invention, a cover is placed above a chip region and an encapsulating material is introduced into a space between the cover and the chip region.

According to the invention, as an influence of surface tension is restrained, occurrence of thin portions of the encapsulating material can be reduced. Therefore, exposure of the conductive lines is avoided while maintaining a thin structure.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

The present invention will be described hereinafter with reference to the accompanying drawings. The drawings used for this description typically illustrate major characteristic parts in order that the present invention will be easily understood.

Figure 1A:
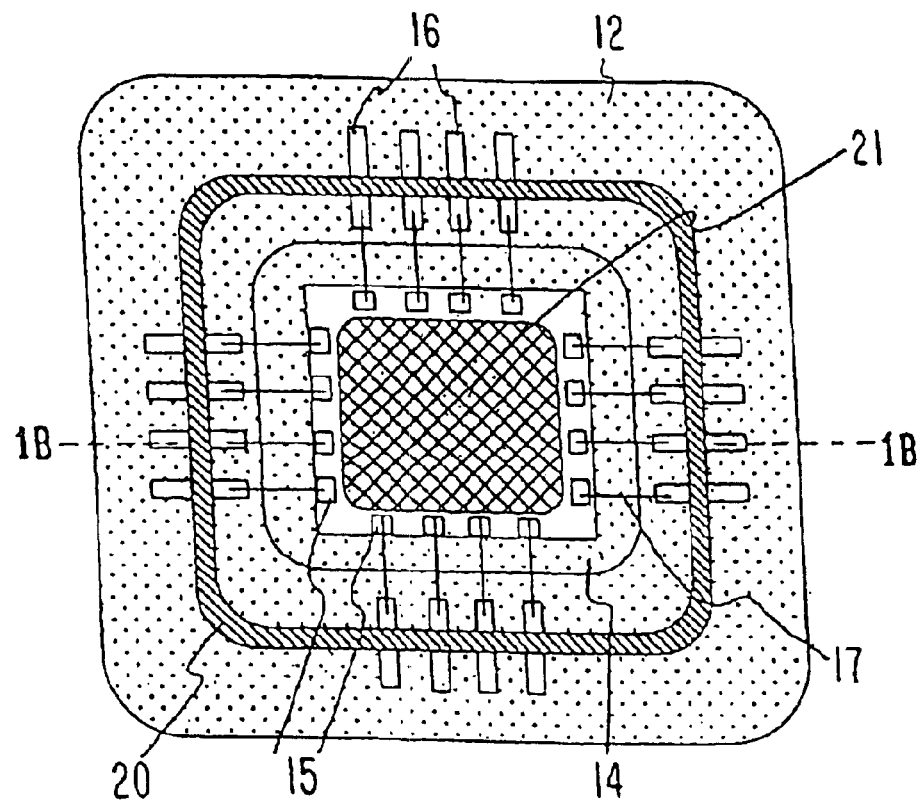
FIG. 1(A) is a plane view of a semiconductor device according to a first preferred embodiment of the present invention.
Figure 1B:
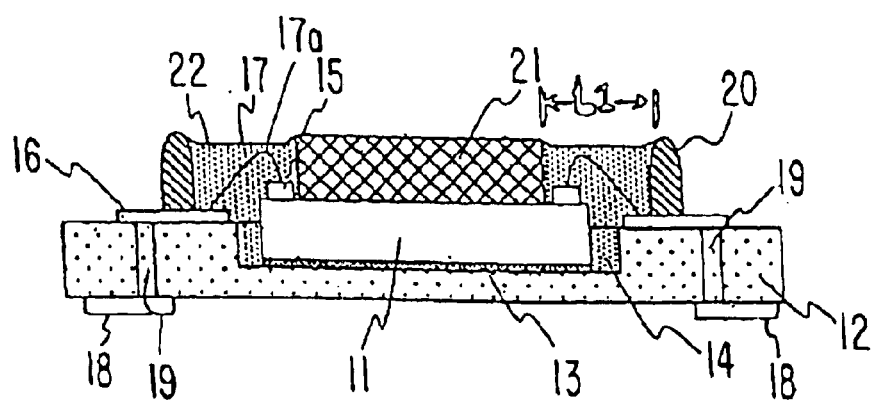
FIG. 1(B) is a cross section at a portion along line 1B—1B shown in FIG. 1(A).

FIG. 1(A) is a plane view of a semiconductor device according to a first preferred embodiment of the present invention. FIG. 1(B) is a cross section view along line 1B—1B shown in FIG. 1(A). In FIG. 1(A), an encapsulating material is not shown to facilitate understanding.

In the semiconductor device according to this embodiment, a semiconductor chip 11 is mounted on a substrate 12, such as a glass epoxy resin, by an adhesive or adhesive tape 13. The substrate 12 has a chip region for mounting the semiconductor chip 11 and a pad region which surrounds the chip region for arrangement of conductive pads. The semiconductor chip 11 is mounted in the chip region. In this embodiment, the semiconductor chip 11 is mounted in a concave portion 14 which has been formed in the chip region. The concave portion 14 is formed by shaving the substrate 12 before mounting the semiconductor chip 11. In this embodiment, the concave portion 14 is formed in the middle of the substrate 12.

The semiconductor chip 11 includes plural electrode pads 15 which are formed thereon. The substrate 12 has plural conductive pads 16 which are formed in the pad region. Conductive lines 17, such as gold lines formed by a wire bonding apparatus, connect the electrode pads 15 with the conductive pads 16. First ends of the conductive pads 16 are connected to the conductive lines 17 and second ends are connected to output pads 18 which are formed on an opposite surface of the substrate through contact holes 19. Also, the second ends are connected to electronic elements, such as condensers, which are formed on the main surface.

Here, the structure described above is designated as a base structure. Further, the semiconductor device of this embodiment includes a first wall 20 and a second wall 21. The first wall 20 is formed in a pad region which surrounds the semiconductor chip 11 and is for containing an encapsulating material 22. The second wall 21 is formed on the semiconductor chip 11. The first wall 20 prevents an outflow of the liquid type resin and is arranged in the periphery of the semiconductor chip. In this example, the first wall 20 is a frame which completely surrounds the semiconductor chip 11.

The semiconductor chip 11, the electrode pads 15, the conductive lines 17 and connecting points between the conductive pads 16 and the conductive lines 17 are covered by an encapsulating material 22, such as a resin.

After preparing the base structure, the first wall 20 may be formed by a print coating method which applies a resin to the pad region through an open portion of a mask having a similar configuration of the first wall 20, and then a blowing method which subjects the resin to a high-pressure air flow. Alternately, the first wall 20 may be formed of a pre-formed frame made of an epoxy resin.

The second wall 21 is preferably formed of a resin facilitate manufacture. For example, a epoxy resin which is resistant to heat and is easy to adjust to a predetermined configuration may be used as the second wall 21. The second wall 21 which is made from the epoxy resin is located on the semiconductor chip 11. Also, a resin which is resistant to heat and is high coefficient of viscosity can be directly dropped on the semiconductor chip 11 to form the-second wall 21. By the former method, a second wall 21 which has an even. surface and height can be obtained. By the latter method, process steps for the obtaining the second wall 21 can be reduced, as compared with the former method.

Figure 7A:
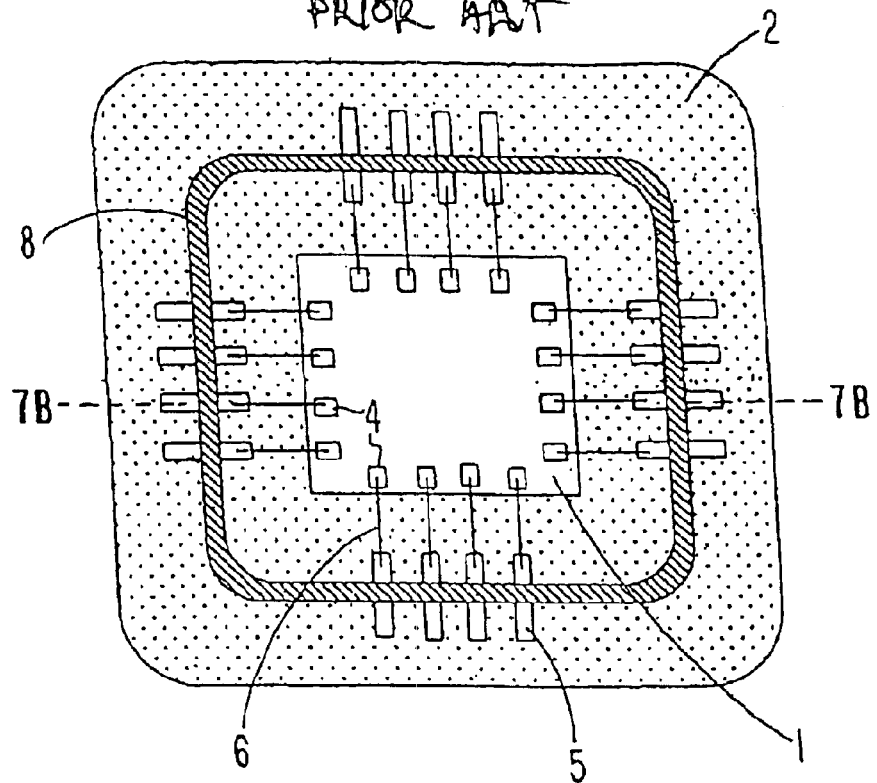
FIG. 7(A) is a plane view of a conventional semiconductor device.
Figure 7B:
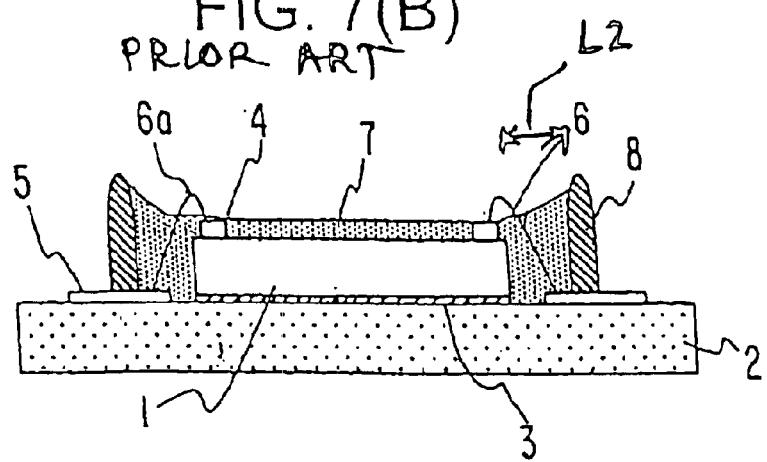
FIG. 7(B) is a cross section at a portion along line 7B—7B shown in FIG. 7(A).

According to the first preferred embodiment, as the second wall 21 is located on the semiconductor chip 11, a space which is filled with the encapsulating material 22 becomes smaller. That is an interval L1 between the first wall 20 and the second wall 21 is shorter than an interval L2 between opposing sides of wall 8 of the conventional device shown in FIG. 7(B). Therefore, as a surface tension becomes small, compared with the conventional device, a thickness of the central portion of the encapsulating material 22 is not made thin. That is, a uniformity of the surface of the encapsulating material 22 can be realized. As a result, the exposure of top portions 17a can be avoided. The shorter the interval L1, the smaller the surface tension. The interval L1 can be defined by a designer, based on a coefficient of viscosity of the encapsulating material, a height of the top portion of the conductive line and/or the size of the semiconductor device.

In this embodiment, the second wall 21 is comprised of a rectangular parallelopiped which covers the semiconductor chip 11 to expose the peripheral area on which the electrode pads 15 are formed. The second wall 21 is not limited to the rectangular parallelopiped. As the second wall 21 is for restraining a space in which the encapsulating material 22 is filled, a frame figure can be applied to the second wall 21. However, the rectangular parallelopiped is desirable because it can protect a surface of the semiconductor chip 11.

In this embodiment, the first wall 20 surrounds the semiconductor chip 11 and the conductive lines 17 completely. However, the first wall of this present invention is not so limited. That is, the first wall need only be sufficient to restrain the encapsulating material. For example, a portion of the first wall, such as a corner, can be opened.

The semiconductor device of the first preferred embodiment of, the invention can prevent an outflow of the encapsulating material, such as the liquid type resin, and minimizes the influence of surface tension. Therefore, the conductive lines 17, particularly the top portions 17a can be reliably covered by the encapsulating material 22. That is, exposure of the conductive lines 17 can be avoided and a quality of the semiconductor device is improved.

Figure 2A:
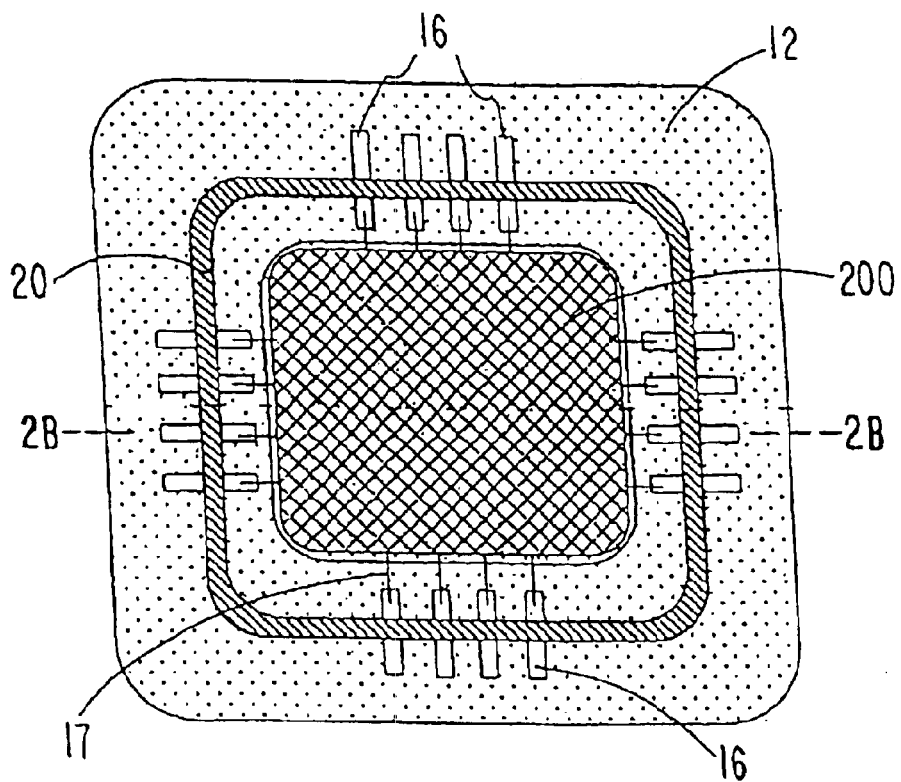
FIG. 2(A) is a plane view of a semiconductor device according to a second preferred embodiment of the present invention.
Figure 2B:
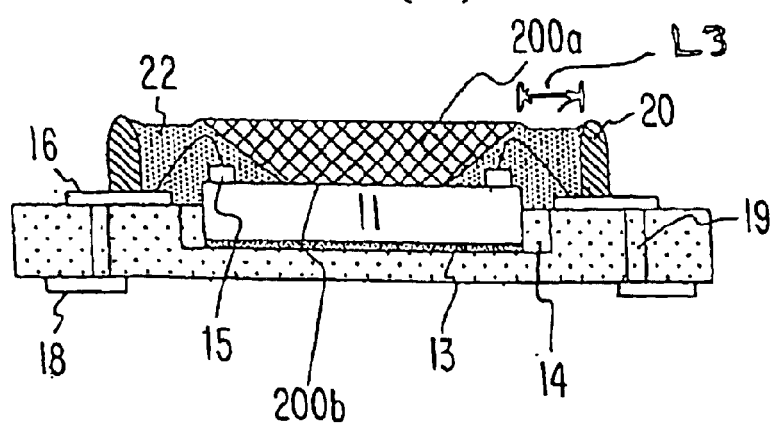
FIG. 2(B) is a cross section at a portion along line 2B—2B shown in FIG. 2(A).

FIG. 2(A) is a plane view of a semiconductor device according to a second preferred embodiment of the present invention. FIG. 2(B) is a cross section view along line 2B—2B shown in FIG. 2(A). In FIG. 2(A), an encapsulating material is not shown to facilitate understanding. In these figures, elements which correspond to the elements of the first preferred embodiment are marked with the same symbols.

In this embodiment, as shown in FIG. 2(B), a cross section of a second wall 200 is a trapezoid. That is, an upper surface 200a of the second wall 200 is wider than a lower surface 200b to form a rectangular prism. Also, the second wall 200 can be formed in a cylindrical configuration. Side surfaces of the rectangular prism 200 are located on the semiconductor chip 11 so as to be separate from the conductive lines 17 by a predetermined distance.

The upper surface of the second wall 200 preferably overlaps the electrode pads 15 and/or the top portions 17a. As an interval L3 between the first wall 20 and the second wall 200 becomes smaller, as compared with the first preferred embodiment, the influence of surface tension can be further minimized. Further, the top portions 17a of the conductive lines 17 can be covered by the encapsulating material 22 more precisely.

A method of manufacture according to a third embodiment will be shown hereinafter referring to FIG. 3(A)–FIG. 3(D). In this embodiment, elements which correspond to the elements of the first and second preferred embodiment are marked with the same symbols.

Figure 3A:
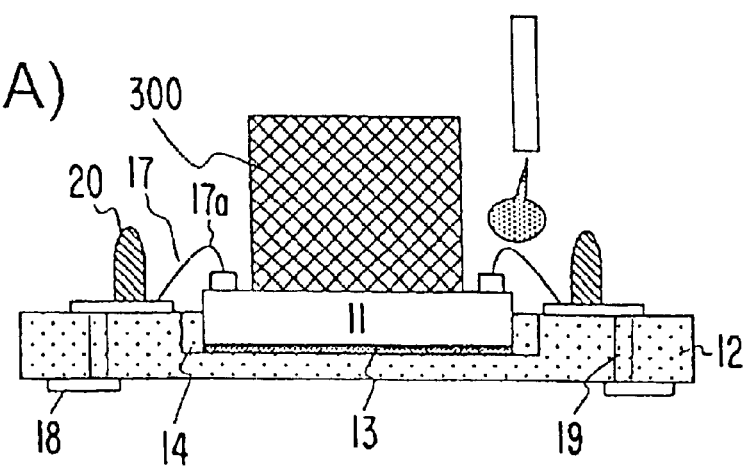
FIG. 3(A)–FIG. 3(D) are cross section views describing a method of manufacturing a semiconductor device according to a third preferred embodiment.

As shown in FIG. 3(A), the first wall 20 is located on the pad region and a second wall 300 which is higher than the first wall 20 is located on the semiconductor chip 11.

Figure 3B:
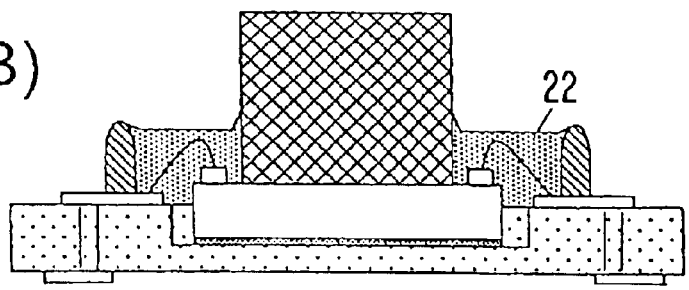
Figure 3C:
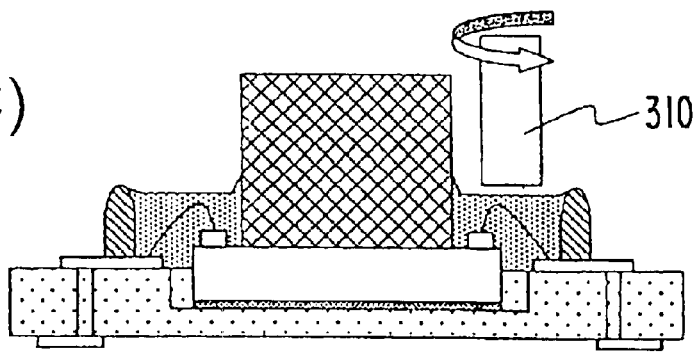
Figure 3D:
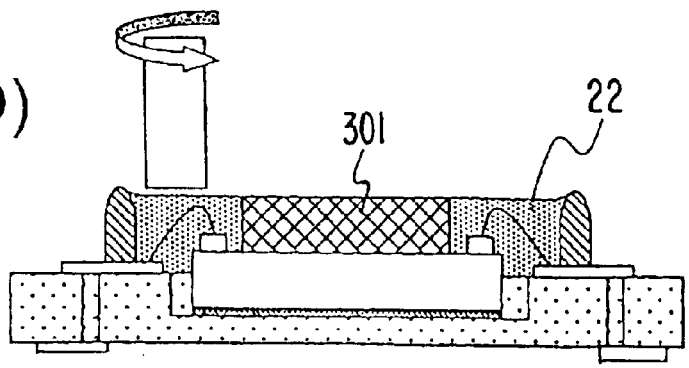

Then, the encapsulating material 22, such as a liquid resin, is introduced into a space between the first wall 20 and the second wall 300, as shown in FIG. 3(B).

After the encapsulating material 22 is stiffened, a portion of the second wall 300 is polished away by a drill 310. Thereby, a substantially planar surface which is comprised of the first wall 20, the second wall 301 and the encapsulating material 22 is formed. In this embodiment, a distance between the top portion 17a and the surface of the encapsulating material 22 is more than 50 μm in order to encapsulate the conductive lines 17 precisely. If necessary, the first wall 20 and the encapsulating material 22 are simultaneously polished with the second wall 300. Thereby, a thickness of the semiconductor device is reduced.

According to the third preferred embodiment, as the second wall which is higher than the first wall is used, the encapsulating material is upwardly gravitated, as compared with the first and second preferred embodiment. Thereby, the top portions of the conductive lines can be covered more precisely.

Further, heights of the second wall, the first wall and the encapsulating material can be adjusted by a polishing. Therefore, a thickness of the semiconductor device can be minimized.

Figure 4A:
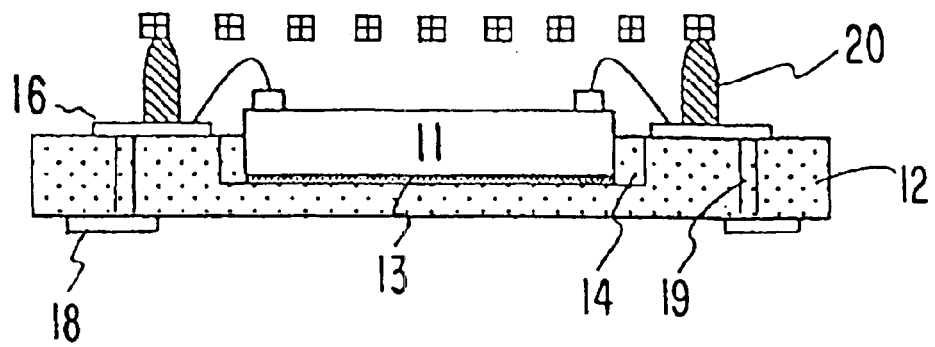
FIG. 4(A)–FIG. 4(C) are cross section views describing a method of manufacturing a semiconductor device according to a fourth preferred embodiment
Figure 4B:
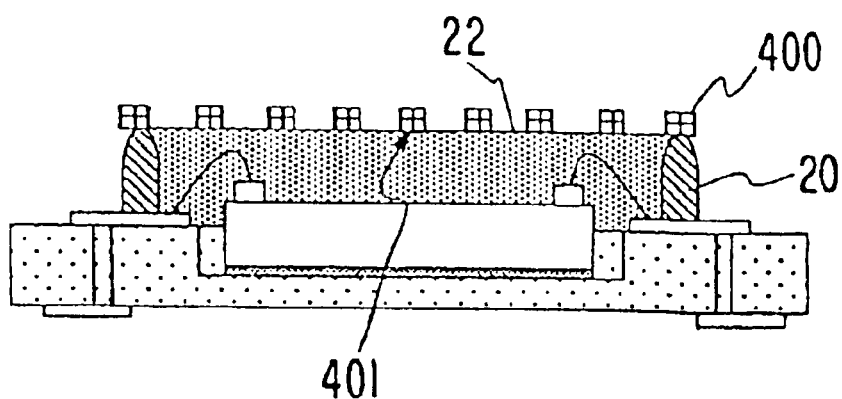
Figure 4C:
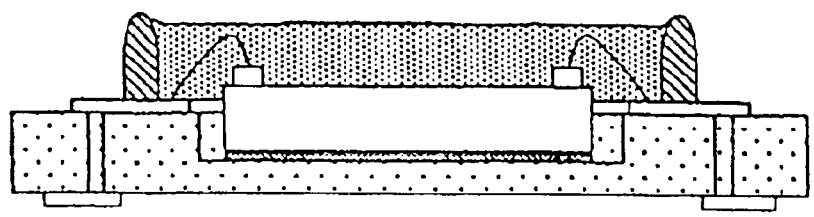
Figure 5:
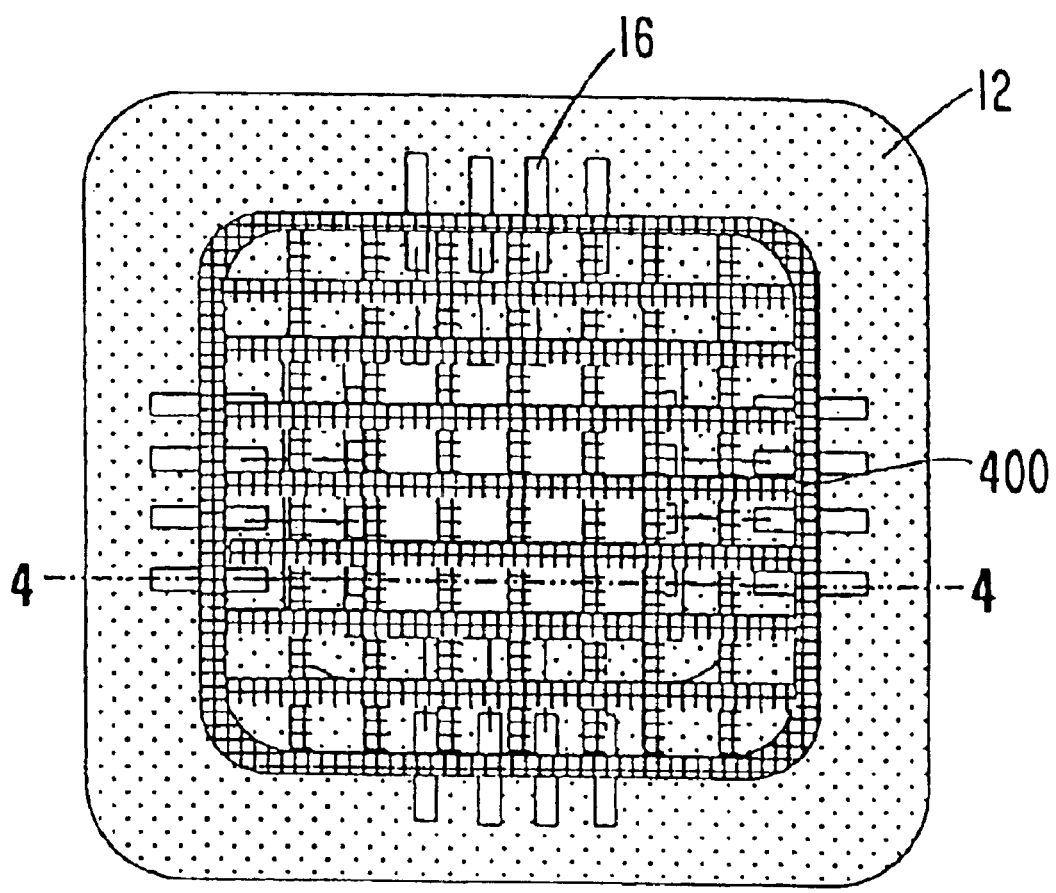
FIG. 5 is a plane view of the semiconductor device according to the fourth preferred embodiment.

A method of manufacture according to a fourth embodiment will be shown hereinafter referring to FIG. 4(A)–FIG. 4(C). FIG. 5 is a plane view of a semiconductor device according to the fourth preferred embodiment of the present invention. FIG. 4(A)–FIG. 4(C) are cross section views along line 4—4 shown in FIG. 5. In this embodiment, elements which correspond to the elements mentioned above are marked with the same symbols.

As shown in FIG. 4(A), the first wall 20 is arranged on the pad region and a cover 400 is placed above the chip region. Edge portions of the cover 400 are contacted with the upper surface of the first wall 20. The cover 400 is used for holding the encapsulating material 22 while the encapsulating material is introduced into a space between the cover 400 and the semiconductor chip 11 or the substrate 12.

Figure 6:
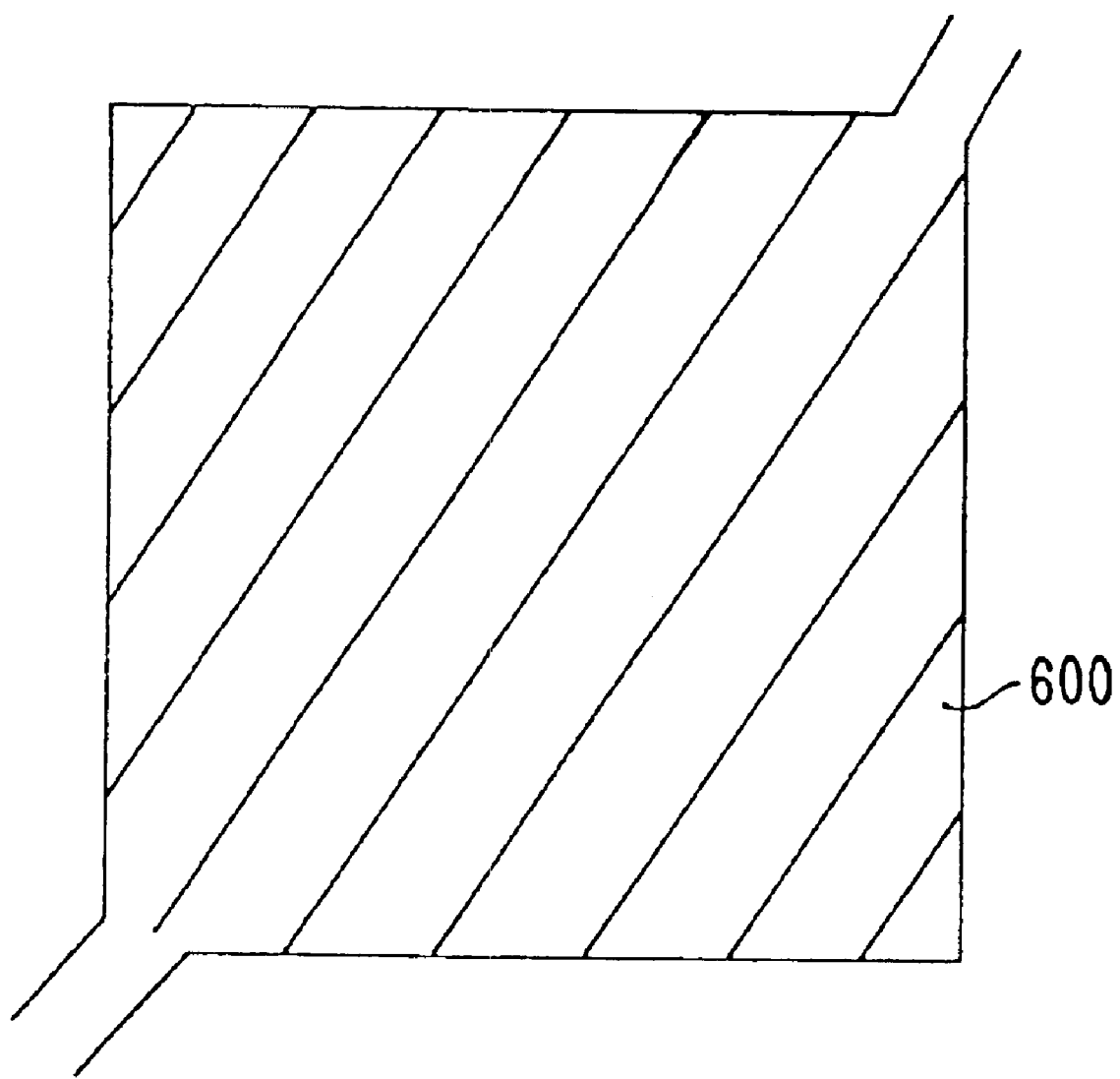
FIG. 6 is a plane view of a cover according the fourth preferred embodiment.

The cover 400 includes opening portions therein which are arranged in a matrix, as shown in FIG. 5, to define a lattice structure. This arrangement is preferable to uniformly introduce the encapsulating material. That is, air in the space is easily exhausted while introducing the encapsulating material to make the process more rapid and efficient. However, the arrangement of the opening portions of the cover 400 is not limited to the matrix. Also, a plane plate 600 which is shown in FIG. 6 can be used. The plate 600 includes open portions which are formed at the corner of the cover 600. The encapsulating material 22 is introduced from one open portion and the air is exhausted from the other open portion. These open portions can be formed on each corner. Also, such open portions can be formed at the corners of the first wall 20 instead of the corners of the cover 600. The covers 400 and 600 can be formed by a plastic, a metal or a glass.

Then, the encapsulating material 22 is introduced into the space through the open portions, as shown in FIG. 4(B). The air is simultaneously exhausted from the space through the opening portions. Surface tension between the cover 400 and liquid resin contributes to making the thickness more uniform by pulling the resin upward where it contacts the cover 400. Therefore, the encapsulating material 22, such as the liquid type resin is spread uniformly and covers the semiconductor chip 11 and the conductive lines 17.

As shown in FIG. 4(C), the cover 400 is removed. A surface 401 of the cover 400 which is contacted with the encapsulating material 22 is applied with a release agent in advance. So, it is easy to remove the cover 400.

In this embodiment, the cover 400 is placed above the chip region so as to keep a distance from which the top portion 17a, more than 50 μm in order to encapsulate the conductive lines 17 more precisely.

In this embodiment, the edge of the cover overlaps the first wall 20. However, in the case where a cover which is smaller than an area defined by the first wall 20, the edge of the cover is not overlapped the first wall 20.

Grid portions of the latticed cover are at least located above the top portions 17a of the conductive lines so as to cover the top portions by the encapsulating material more precisely.

If the air in the space is exhausted by an aspirator through one open portion, a speed of introducing the encapsulating material can be increased to thereby shorten the process time.

According to the fourth preferred embodiment, since the encapsulating material is introduce using a common cover, the semiconductor device can be made at lower costs as compared to the previous preferred embodiments.

Further, as a location of the cover can be adjusted responsive to the top portions of the conductive lines, the conductive lines can be encapsulated more precisely.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as falling within the true scope of the invention.

What is claimed is:

1. A method for fabricating a semiconductor device comprising:
   providing a substrate which has a chip region and a pad region which is at a periphery of the chip region;
   placing plural conductive pads on the pad region;
   mounting a semiconductor chip on the chip region, wherein the semiconductor chip includes a plurality of electrode pads which are formed thereon;
   connecting conductive lines between the electrode pads and the conductive pads;
   forming a first wall in the pad region;
   forming a second wall on the semiconductor chip so as to face the first wall, such that the conductive lines are arranged between the first and second walls; and
   supplying an encapsulating material into a space between the first and second walls so as to encapsulate the conductive lines.

2. The method according to claim 1, further comprising shaving a top surface of the second wall after supplying the encapsulating material.

3. The method according to claim 1, wherein a concave portion is located in the chip portion, and wherein the semiconductor chip is mounted in the concave portion.

4. A method for fabricating a semiconductor device comprising:
   providing a substrate which has a chip region and a pad region which is at a periphery of the chip region;
   placing plural conductive pads on the pad region;
   mounting a semiconductor chip on the chip region, wherein the semiconductor chip includes a plurality of electrode pads which are formed thereon;

connecting the electrode pads with the conductive pads by conductive lines;

forming a first wall in the pad region;

placing a cover above the chip region, wherein the cover includes an open portion for introduction of an encapsulating material; and introducing the encapsulating material into a space between the cover and the chip region through the open portion so as to encapsulate a surface of the semiconductor chip and the conductive lines.

5. The method according to claim 4, wherein the cover has an upper surface and a lower surface which faces the chip region, wherein a release agent is formed on the lower surface before introducing the encapsulating material.

6. The method according to claim 4, wherein the cover is a lattice structure, and wherein grids of the cover are placed so as to extend over an upper surface of the conductive lines.

7. The method according to claim 4, wherein the first wall surrounds the chip region, and wherein an area of the cover is less than an area which is surrounded by the first wall.

8. The method according to claim 4, wherein the cover includes a second open portion through which a gas in a space between the chip region and the cover is exhausted while introducing the encapsulating material.

9. The method according to claim 8, wherein the gas is exhausted by an aspirator.

10. A method for fabricating a semiconductor device comprising:

providing a substrate which has a chip region and a pad region which is at a periphery of the chip region;

providing a conductive pad on the pad region;

mounting a semiconductor chip on the chip region, wherein the semiconductor chip includes an electrode pad thereon;

forming a first wall in the pad region;

forming a second wall on the semiconductor chip, the second wall being formed of a resin and facing toward the first wall;

connecting a conductive line between the electrode pad and the conductive pad, the conductive line being arranged between the first wall and the second wall; and supplying an encapsulating material between the first and second walls to encapsulate the conductive line, wherein an upper surface of the first wall and an upper surface of the second wall are set at a substantially same level.

11. A method for fabricating a semiconductor device comprising:

providing a substrate having a conductive pad affixed thereto;

mounting a semiconductor chip on the substrate, the semiconductor chip having an electrode pad formed on a surface thereof;

forming a first wall on a surface of the substrate, wherein the conductive pad is affixed to a surface of the substrate between the first wall and the semiconductor chip;

connecting a conductive line between the conductive pad and the electrode pad;

forming a second wall on the semiconductor chip; and supplying an encapsulating material between and in direct contact with the first and second walls to be contained by the first and second walls, to encapsulate the electrode pad and the conductive line, wherein an upper surface of the first wall and an upper surface of the second wall are at a substantially same level.

12. The method for fabricating a semiconductor device of claim 11, wherein said forming the second wall comprises providing the second wall so as to have a first surface mounted on the semiconductor chip and a second surface opposite the first surface, the second surface being longer than the first surface so that the second wall overlaps above the conductive line and the electrode pad.

13. The method for fabricating a semiconductor chip of claim 11, wherein the substrate includes a concave portion having a central region and a peripheral region surrounding the central region, said mounting a semiconductor chip comprises arranging the semiconductor chip in the central region of the concave portion, and said supplying an encapsulating material comprises filling the peripheral region of the concave portion with the encapsulating material.

14. The method for fabricating a semiconductor chip of claim 11, wherein the encapsulating material is a resin.

15. The method for fabricating a semiconductor chip of claim 11, wherein the second wall is formed of resin.

* * * * *